(12) United States Patent  
Murase et al.

(10) Patent No.: US 8,558,641 B2
(45) Date of Patent: Oct. 15, 2013

(54) HIGH-FREQUENCY MODULE

(75) Inventors: Hisanori Murase, Nagaokakyo (JP); Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 432 days.

(21) Appl. No.: 12/905,275

(22) Filed: Oct. 15, 2010

(65) Prior Publication Data

US 2011/0095843 A1    Apr. 28, 2011

(30) Foreign Application Priority Data

Oct. 27, 2009    (JP) ................. 2009-246198

(51) Int. Cl.
| H01P 5/12 | (2006.01) |
| H03H 7/46 | (2006.01) |
| H04B 1/38 | (2006.01) |
| H03H 9/70 | (2006.01) |
| H03H 9/72 | (2006.01) |

(52) U.S. Cl.
USPC ........... 333/126; 333/129; 333/132; 333/133; 455/78; 455/82

(58) Field of Classification Search
USPC ......... 333/132, 133, 134, 136, 185, 193, 202, 333/126, 129; 455/78, 82, 83
See application file for complete search history.

(56) References Cited

U.S. PATENT DOCUMENTS

| 7,053,731 B2 * | 5/2006 | Iwamoto et al. ............. 333/133 |
| 2003/0098757 A1 | 5/2003 | Iwamoto et al. |
| 2007/0229189 A1 | 10/2007 | Iwata |
| 2008/0231387 A1 | 9/2008 | Nagai |

FOREIGN PATENT DOCUMENTS

| CN | 101047398 A | 10/2007 |
| CN | 101401304 A | 4/2009 |
| JP | 07297670 | * 11/1995 |
| JP | 8-274427 A | 10/1996 |
| JP | 2002-325048 A | 11/2002 |
| JP | 2003-163570 A | 6/2003 |
| JP | 2004-253639 A | 9/2004 |
| JP | 2004-260737 A | 9/2004 |
| JP | 2005-136887 A | 5/2005 |
| JP | 2006-254196 A | 9/2006 |
| JP | 2006-319512 A | 11/2006 |
| JP | 2007129459 A | * 5/2007 |
| JP | 2007-151123 A | 6/2007 |
| JP | 2009-089165 A | 4/2009 |

OTHER PUBLICATIONS

Official Communication issued in corresponding Japanese Patent Application No. 2009-246198, mailed on Feb. 21, 2012.

* cited by examiner

Primary Examiner — Barbara Summons
(74) Attorney, Agent, or Firm — Keating & Bennett, LLP

(57) ABSTRACT

In a high-frequency module, a duplexer element and a matching element are mounted on a surface of a multilayer substrate. On a layer close to the surface, an individual-terminal-side wiring electrode connected to an individual terminal of the duplexer element is provided. On two layers below the layer close to the surface, first and second ground electrodes are respectively provided. On a layer below the layers on which the first and second ground electrodes are provided, a common-terminal-side wiring electrode connected to the common terminal of the duplexer element and one end of the matching element is provided. On a layer close to a bottom surface of the multilayer substrate, a third ground electrode connected to the other end of the matching element is provided.

8 Claims, 5 Drawing Sheets

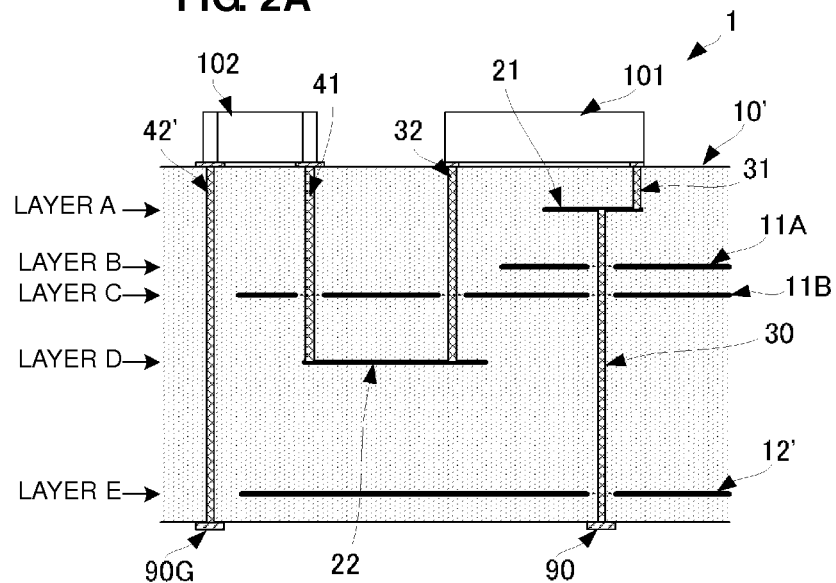
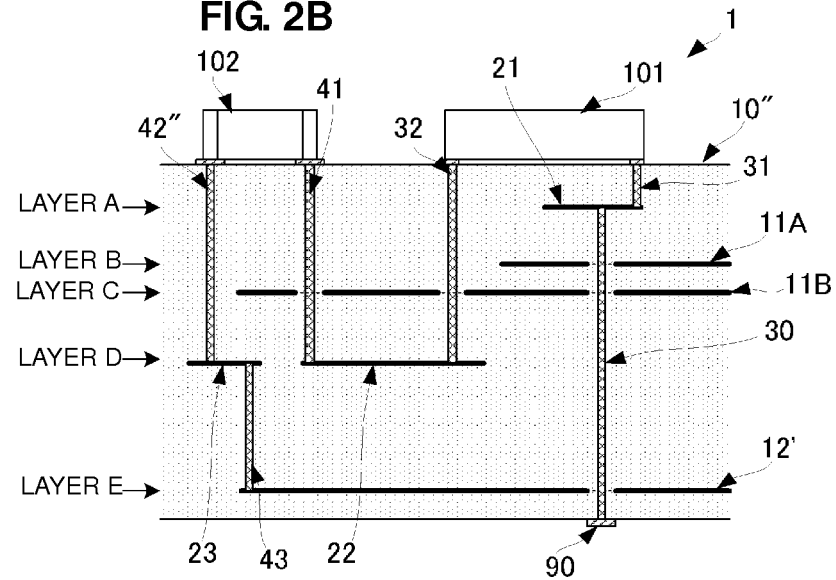

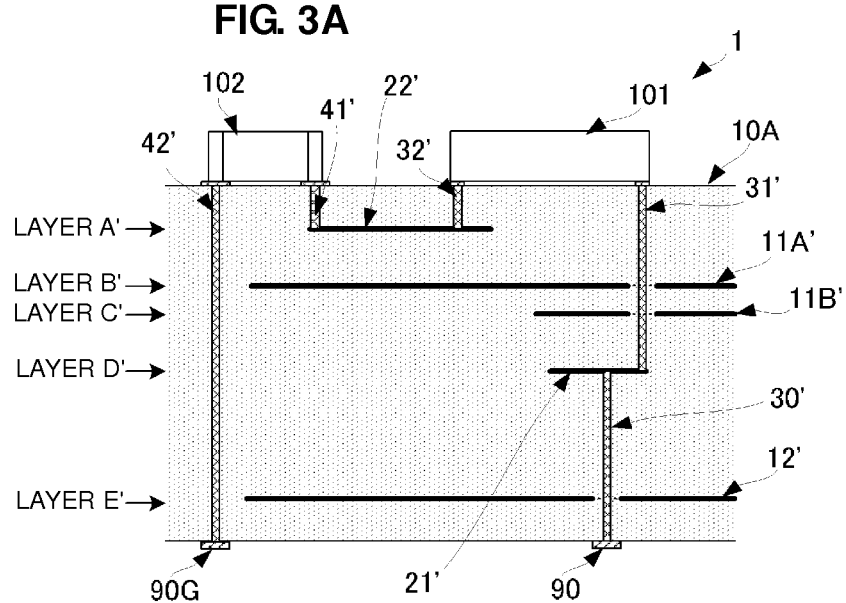
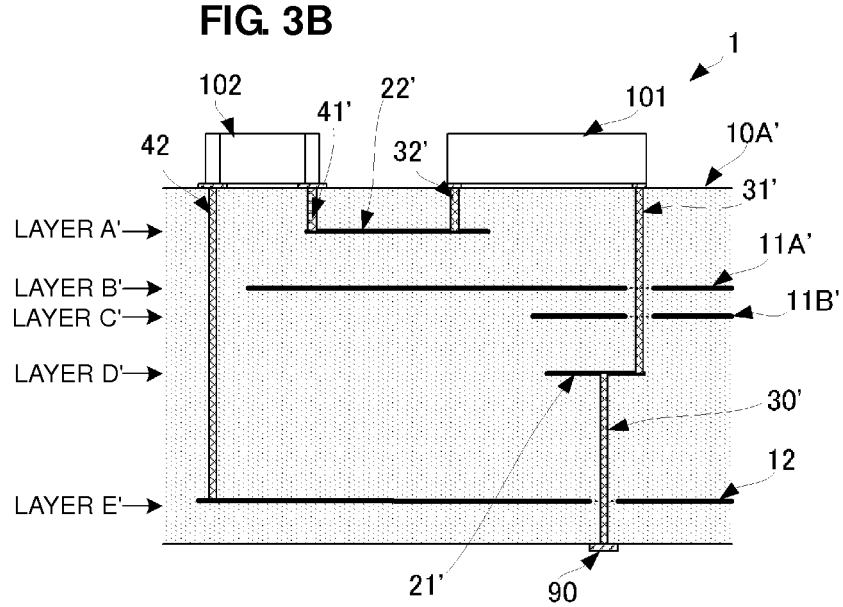

HIGH-FREQUENCY MODULE

BACKGROUND OF THE INVENTION

1. Field of the Invention

The present invention relates to high-frequency modules including a transmission circuit and a reception circuit connected to an antenna.

2. Description of the Related Art

Various high-frequency modules have been proposed that include a transmission circuit and a reception circuit connected to an antenna or a plurality of transmission/reception circuits connected to the antenna. In such high-frequency modules, two circuits (hereinafter, referred to as a transmission circuit and a reception circuit for ease of explanation) are connected to an antenna through a duplexer or an integrated circuit (IC) switch. The duplexer includes a common terminal to be connected to the antenna, and individual terminals to be connected to the respective transmission and reception circuits. The duplexer also includes, for example, a first surface acoustic wave (SAW) filter having a passband in a transmission signal band, and a second SAW filter having a passband in a reception signal band. The first SAW filter is arranged between the transmission-side individual terminal and the common terminal, and the second SAW filter is arranged between the reception-side individual terminal and the common terminal.

Furthermore, in such high-frequency modules, a matching circuit arranged to match impedance between the duplexer and an external circuit, such as the antenna connected to the common terminal, is connected to the common terminal.

As described in Japanese Unexamined Patent Application Publication No. 2003-163570, a high-frequency module is defined by a multilayer circuit module. In the high-frequency module, the duplexer is a discrete circuit element and is mounted on a multilayer substrate defining the multilayer circuit module. Additionally, the matching circuit defined by an electrode pattern disposed in the multilayer substrate or on a surface of the substrate. The duplexer and the matching circuit are connected to a common ground electrode arranged near the duplexer and the matching circuit.

However, the configuration described above may cause the following problems. FIGS. 5A and 5B are cross-sectional views to describe the problems caused in a high-frequency module according to the related art that includes a configuration described in Japanese Unexamined Patent Application Publication No. 2003-163570.

In a high-frequency module 1H shown in FIG. 5A, a wiring pattern 22H arranged near a common terminal of a duplexer 101 and a wiring pattern 21H arranged near individual terminals of the duplexer 101 are closely arranged in the same layer. Accordingly, the wiring pattern 21H is electromagnetically coupled to the wiring pattern 22H. Because of this electromagnetic coupling, a signal originally flowing from the common terminal of the duplexer 101 to a matching element 102 leaks to the individual terminals of the duplexer 101 through the wiring patterns 22H and 21H. Since a common ground 11H closely opposes to the wiring pattern 21H, the common ground 11H is electromagnetically coupled to the wiring pattern 21H. Because of this electromagnetic coupling, a signal originally flowing from the common terminal of the duplexer 101 to ground through the matching element 102 leaks to the individual terminals of the duplexer 101 through the common ground 11H and the wiring pattern 21H.

In a high-frequency module 1H shown in FIG. 5B, since a wiring pattern 22H' arranged near a common terminal of a duplexer 101 and a wiring pattern 21H arranged near individual terminals of the duplexer 101 are arranged so as to be separated from each other in a lamination direction through a common ground 11H, electromagnetic coupling in the same layer is prevented. However, electromagnetic coupling between the common ground 11H and the wiring pattern 21H illustrated in FIG. 5A occurs. Furthermore, referring to FIG. 5B, since the common ground 11H closely opposes to the wiring pattern 22H', the common ground 11H is electromagnetically coupled to the wiring pattern 22H'. Because of this electromagnetic coupling, a signal originally flowing from the common terminal of the duplexer 101 to the matching element 102 leaks to the individual terminals of the duplexer 101 through the wiring pattern 22H', the common ground 11H, and the wiring pattern 21H.

Since, for example, a transmission signal that is input from the transmission-side individual terminal of the duplexer 101 and output to the common terminal thereof leaks to a reception circuit in the configurations according to the related art, isolation between a transmission circuit and the reception circuit is reduced in a high-frequency module even if the duplexer 101 provides the desired isolation between the individual terminals.

SUMMARY OF THE INVENTION

To overcome the problems described above, preferred embodiments of the present invention provide a high-frequency module in which high isolation is maintained between individual terminals of a duplexer in the high-frequency module that is defined by a multilayer substrate including the duplexer and a matching circuit connected to a common-terminal side of the duplexer.

A high-frequency module according to a preferred embodiment of the present invention includes a duplexer including a common terminal and a plurality of individual terminals connected to the common terminal through different filters, a matching circuit connected to the common terminal of the duplexer, and a multilayer substrate, the duplexer being mounted on the multilayer substrate and the matching circuit being mounted on the multilayer substrate or being defined by an electrode pattern in the multilayer substrate. The multilayer substrate included in the high-frequency module includes an individual-terminal-side wiring electrode, a common-terminal-side wiring electrode, a first ground electrode, and a second ground electrode. The individual-terminal-side wiring electrode is defined by an electrode pattern provided on a predetermined layer of the multilayer substrate. The common-terminal-side wiring electrode is defined by an electrode pattern provided on a different layer of the multilayer substrate from that of the individual-terminal-side wiring electrode. The first and second ground electrodes are provided on different layers arranged between the layer including the common-terminal-side wiring electrode and the layer including the individual-terminal-side wiring electrode in a lamination direction.

Since the wiring electrode near the common terminal of the duplexer and the wiring electrode near the individual terminals thereof are provided on different layers of the multilayer substrate, electromagnetic coupling between these electrodes in the same layer is prevented. Furthermore, even if the common-terminal-side wiring electrode and the individual-terminal-side wiring electrode are electromagnetically coupled to the first and second ground electrodes, a high-frequency signal is not propagated through the first and second ground electrodes because the first and second ground electrodes are not electromagnetically coupled to each other. Thus, the plurality of ground electrodes provided between the layer including the common-terminal-side wiring electrode and the layer including the individual-terminal-side electrode prevents the common-terminal-side wiring electrode and the individual-terminal-side wiring electrode from being electromagnetically coupled through the common ground electrodes. In this manner, reduced isolation between external-connection terminals connected to respective individual terminals is prevented in the high-frequency module.

An electrode pattern connecting the common terminal of the duplexer to the matching circuit may preferably define the common-terminal-side wiring electrode of the high-frequency module according to a preferred embodiment of the present invention.

This configuration includes a wiring pattern that connects the common terminal of the duplexer to the matching circuit and defines the common-terminal-side wiring electrode that is capable of preventing electromagnetic coupling.

An electrode pattern connecting the matching circuit to a ground electrode may preferably define the common-terminal-side wiring electrode of the high-frequency module according to a preferred embodiment of the present invention.

This configuration includes a wiring pattern that connects the matching circuit to ground and defines the common-terminal-side wiring electrode that is capable of preventing electromagnetic coupling.

The electrode pattern connecting the common terminal of the duplexer to the matching circuit in the high-frequency module according to a preferred embodiment of the present invention may preferably be provided on the duplexer mounting surface of the multilayer substrate or on a layer between the duplexer mounting surface and the layers including the first and second ground electrodes.

With this configuration, the arrangement of the wiring pattern connecting the common terminal of the duplexer to the matching circuit near the duplexer mounting surface reduces the length of the wiring pattern. Thus, transmission loss of a signal passing through the common terminal can also be reduced.

The matching circuit in the high-frequency module according to a preferred embodiment of the present invention may preferably include a discrete circuit element mounted on the multilayer substrate.

With this configuration, the impedance of the matching circuit can be changed simply by replacing the discrete circuit element included in the matching circuit. Thus, the design of the matching circuit can be easily modified.

The ground electrode connected to the matching circuit in the high-frequency module according to a preferred embodiment of the present invention may preferably be a third ground electrode different from the first and second ground electrodes.

With this configuration, the use of a dedicated third ground electrode for the matching circuit prevents isolation from being reduced and parasitic components, e.g., a parasitic inductor and a parasitic capacitor, of the matching circuit from occurring.

The matching circuit in the high-frequency module according to a preferred embodiment of the present invention may preferably include a discrete circuit element mounted on the multilayer substrate. A land on which the discrete circuit element is mounted may preferably be directly connected to the third ground electrode.

With this configuration, the dedicated third ground electrode for the discrete circuit element of the matching circuit prevents isolation from being reduced and parasitic components, e.g., a parasitic inductor and a parasitic capacitor, of the matching circuit from occurring.

The matching circuit in the high-frequency module according to a preferred embodiment of the present invention may preferably include a discrete circuit element mounted on the multilayer substrate. A land on which the discrete circuit element is mounted may preferably be directly connected to an external-connection electrode of the multilayer substrate defining a ground connection.

With this configuration, connection of the discrete circuit element of the matching circuit directly to the external-ground-connection electrode of the multilayer substrate prevents isolation from being reduced and parasitic components, e.g., a parasitic inductor and a parasitic capacitor, of the matching circuit from occurring.

In accordance with various preferred embodiments of the present invention, a high-frequency module including a duplexer, a matching circuit connected to a common-terminal side of the duplexer, and a multilayer substrate can maintain high isolation between individual terminals of the duplexer. Accordingly, a high-frequency module having good transmission characteristics is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B are cross-sectional views illustrating other multilayer structures of the high-frequency module according to the first preferred embodiment of the present invention.

FIGS. 3A and 3B are cross-sectional views illustrating multilayer structures of a high-frequency module according to a second preferred embodiment of the present invention.

DETAILED DESCRIPTION OF THE PREFERRED EMBODIMENTS

A high-frequency module according to a first preferred embodiment of the present invention will be described with reference to the accompanying drawings.

Figure 1A:
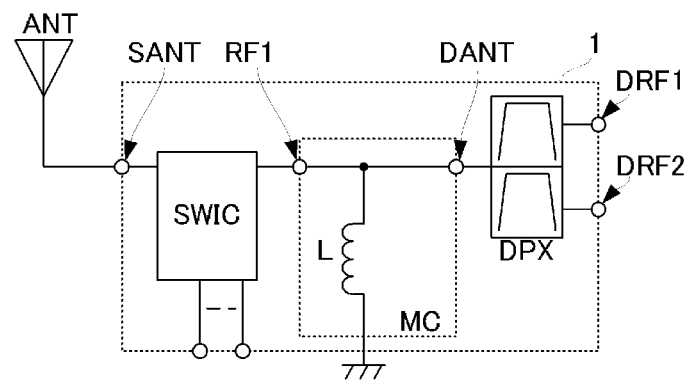
FIGS. 1A and 1B are a circuit diagram illustrating a schematic circuit configuration of a high-frequency module according to a first preferred embodiment of the present invention and a cross-sectional view illustrating a multilayer structure thereof.
Figure 1B:
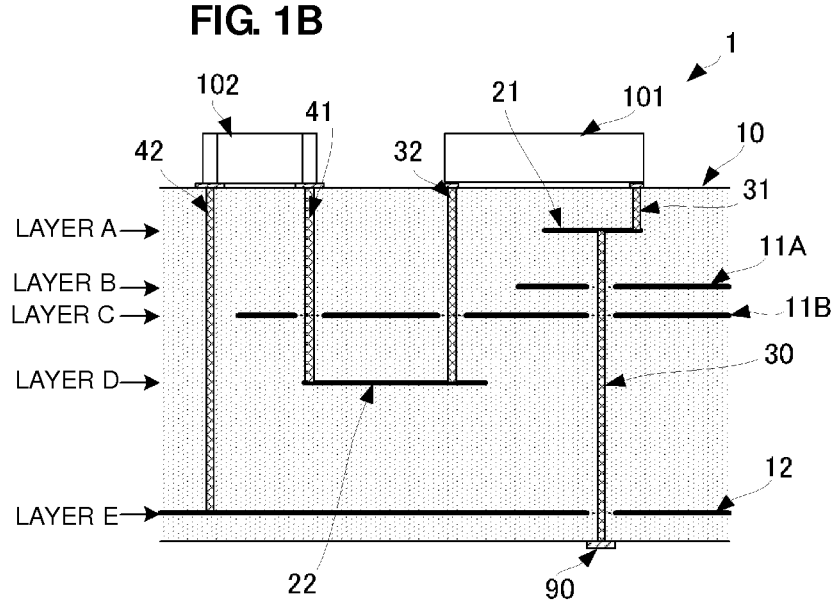

FIG. 1A is a circuit diagram illustrating a schematic circuit configuration of a high-frequency module 1 according to the first preferred embodiment, and FIG. 1B is a cross-sectional view illustrating the multilayer structure of the high-frequency module 1 illustrated in FIG. 1A.

The high-frequency module 1 according to the first preferred embodiment includes a switch element SWIC and a duplexer DPX. The switch element SWIC includes an antenna common terminal SANT, a plurality of RF terminals, and driving power input terminals. FIG. 1A illustrates the antenna common terminal SANT and one of the plurality of RF terminals of the switch element SWIC but does not illustrate the other terminals. The antenna common terminal SANT of the switch element SWIC is connected to an antenna ANT. A specific RF terminal RF1 of the switch element SWIC is connected to a common terminal DANT of the duplexer DPX through a matching circuit MC.

The duplexer DPX includes one common terminal DANT and two individual terminals DRF1 and DRF2. A first SAW filter is arranged between the common terminal DANT and the individual terminal DRF1, and a second SAW filter is arranged between the common terminal DANT and the individual terminal DRF2. The first and second SAW filters have different passbands. For example, the first SAW filter preferably has a passband in a frequency band of a transmission communication signal transmitted through the duplexer DPX, and the second SAW filter preferably has a passband of a frequency band of a reception communication signal. The duplexer DPX is a discrete component mounted on a surface of a multilayer substrate defining the high-frequency module 1 to be described below.

The matching circuit MC includes a signal line connecting the RF terminal RF1 of the switch element SWIC to the common terminal DANT of the duplexer DPX and a matching element including an inductor L connected between the signal line and ground. A value of each element in the matching circuit MC is set so that the impedance of the common terminal DANT of the duplexer DPX matches the impedance of the switch element SWIC on the antenna side of the duplexer DPX in a frequency band of communication signals transmitted through the duplexer DPX.

The inductor L defining the matching element may preferably be a discrete component or may preferably be an electrode pattern provided inside the multilayer substrate, for example. Hereinafter, the inductor L is described as a discrete component. Since the impedance of the matching circuit MC can be changed simply by replacing the mounted discrete inductor L, the specifications of the matching circuit MC can advantageously be easily changed.

Such a high-frequency module 1 is preferably defined by a multilayer substrate 10 and discrete components mounted on a surface of the multilayer substrate 10 as illustrated in FIG. 1B. FIG. 1B omits an illustration of the switch element SWIC and electrode patterns connected to the switch element SWIC.

The multilayer substrate 10 includes a plurality of dielectric layers. Each of the laminated dielectric layers includes electrode patterns which define the circuits of the high-frequency module 1.

Lands and predetermined wiring patterns for a discrete component 101 of the duplexer DPX (hereinafter, simply referred to as a duplexer element 101) and a discrete component 102 of the inductor L (hereinafter, simply referred to as a matching element 102) are provided on a top surface of the multilayer substrate 10. The duplexer element 101 and the matching element 102 are mounted on the corresponding lands.

On a layer A close to the top surface, an individual-terminal-side wiring electrode 21 is provided. The individual-terminal-side wiring electrode 21 is connected, through a via hole 31, to an individual-terminal-side land for the duplexer element 101 provided on the top surface.

On a layer B that is below the layer A with respect to the top surface, a ground electrode 11A (corresponding to "a first ground electrode") is provided. The ground electrode 11A is arranged to cover at least an area of the individual-terminal-side wiring electrode 21. In this manner, the individual-terminal-side wiring electrode 21 opposes to the ground electrode 11A with a predetermined gap therebetween, so that impedance of the individual-terminal-side wiring electrode 21 can be set to a predetermined value.

On a layer C adjacent to and below the layer B with respect to the top surface, a ground electrode 11B (corresponding to "a second ground electrode") is provided. The ground electrode 11B is arranged to cover at least an area of a common-terminal-side wiring electrode 22 on a layer D, to be described later, and the area of the individual-terminal-side wiring electrode 21.

On the layer D below the layer C with respect to the top surface, the common-terminal-side wiring electrode 22 is provided. Since the ground electrode 11B is arranged at a position on the layer C corresponding to the position of the common-terminal-side wiring electrode 22, the common-terminal-side wiring electrode 22 opposes the ground electrode 11B with a predetermined gap therebetween, so that the impedance of the common-terminal-side wiring electrode 22 can be set to a predetermined value.

One end of the common-terminal-side wiring electrode 22 is connected, through a via hole 32, to a common-terminal-side land for the duplexer element 101 provided on the top surface. The other end of the common-terminal-side wiring electrode 22 is connected, through a via hole 41, to one land for the matching element 102 provided on the top surface.

On a layer E below the layer D with respect to the top surface and near a bottom surface of the multilayer substrate 10, a ground electrode 12 (corresponding to "a third ground electrode") is arranged over substantially the entire surface of the multilayer substrate 10 in plan view. The ground electrode 12 is connected, through a via hole 42, to the other land for the matching element 102 provided on the top surface.

On the bottom surface of the multilayer substrate 10, an external connection electrode 90 is provided. For example, as illustrated in FIG. 1B, the external-connection electrode 90 is preferably connected to the individual-terminal-side wiring electrode 21 through a via hole 30.

Figure 5A:
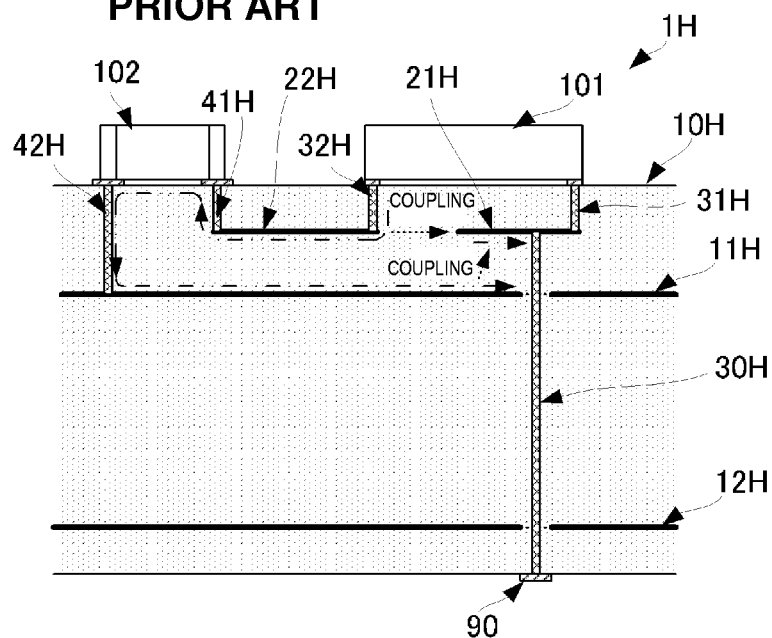
FIGS. 5A and 5B are cross-sectional views of high-frequency modules according to the related art.
Figure 5B:
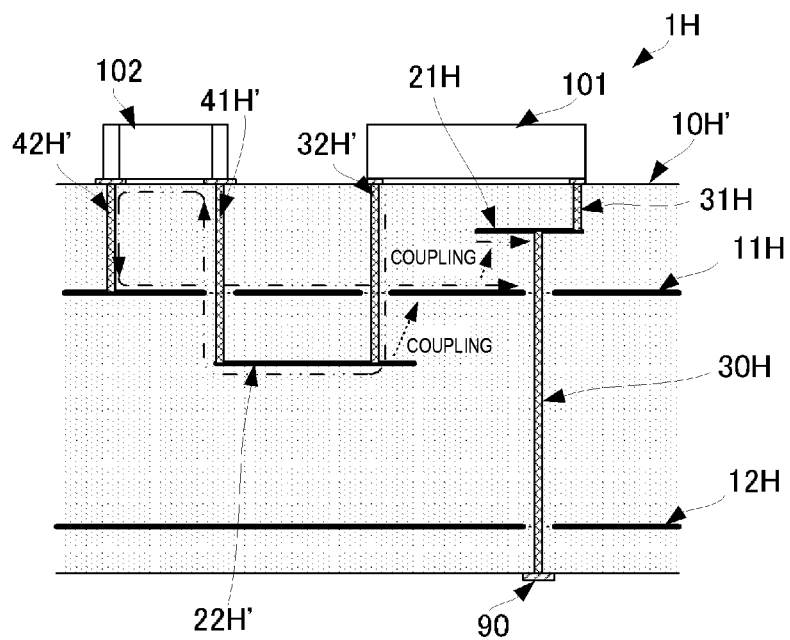

Such a configuration eliminates common ground electrodes near the individual-terminal-side wiring electrode 21 on the individual-terminal side of the duplexer element 101 and the common-terminal-side wiring electrode 22 on the common-terminal side of the duplexer element 101, i.e., the side of the matching element 102. Accordingly, such a configuration effectively prevents signal leakage to the individual-terminal side from the common-terminal side of the duplexer element 101 through the common ground electrodes that occurs in the configurations according to the related art illustrated in FIGS. 5A and 5B.

Additionally, such a configuration includes two ground electrodes 11A and 11B arranged between the individual-terminal-side wiring electrode 21 and the common-terminal-side wiring electrode 22. In this configuration, the individual-terminal-side wiring electrode 21 and the common-terminal-side wiring electrode 22 may be electromagnetically coupled to the ground electrode 11A and the ground electrode 11B, respectively. However, since the ground electrodes 11A and 11B are provided on different layers, electromagnetic coupling of the ground electrodes 11A and 11B does not occur and leakage of a signal therethrough is effectively prevented. Thus, this configuration effectively prevents a signal from leaking to the individual-terminal-side wiring electrode 21 from the common-terminal-side wiring electrode 22 through the ground electrodes 11A and 11B.

Referring to FIG. 1A, for example, when a transmission signal is input from the individual terminal DRF1 of the duplexer DPX and then is output from the common terminal DANT, leakage of the transmission signal to the individual terminal DRF2 of the duplexer DPX through the matching circuit MC is effectively prevented. As a result, the high-frequency module 1 maintains high isolation between a transmission side and a reception side in accordance with the specification of the duplexer DPX.

In the first preferred embodiment, an example is described in which the ground electrode 12 on the layer near the bottom surface of the multilayer substrate 10 is directly connected to the other land for the matching element 102 through the via hole 42. However, configurations illustrated in FIGS. 2A and 2B provide advantages that are similar to those of the configuration illustrated in FIG. 1B. FIGS. 2A and 2B are cross-sectional views illustrating other multilayer structures of the high-frequency module 1 according to the first preferred embodiment.

The high-frequency module 1 includes a multilayer substrate 10' illustrated in FIG. 2A including an external-connection ground electrode 90G for the other land for the matching element 102. The other land for the matching element 102 is not connected to a ground electrode 12' but is connected to the external-connection ground electrode 90G through a via hole 42'. Since the matching element 102 to be connected between a signal line and ground is directly connected to the external-connection ground electrode 90G, the other land for the matching element 102 is connected to ground without a wiring pattern routed in the multilayer substrate 10'. In addition to the above-described advantages, such a configuration more effectively prevents reduced isolation and parasitic components (i.e., a parasitic inductor and a parasitic capacitor) of the matching circuit MC.

The high-frequency module 1 includes a multilayer substrate 10" illustrated in FIG. 2B including a routing electrode 23 for the other land for the matching circuit 102 on the layer D, i.e., on the same layer that includes the common-terminal-side wiring electrode 22. The routing electrode 23 is connected to the other land for the matching element 102 through a via hole 42" and is also connected to a ground electrode 12' on the layer E through a via hole 43. As described above, such a configuration eliminates common ground electrodes near the common-terminal-side wiring electrode 22 and the individual-terminal-side wiring electrode 21 but includes two ground electrodes 11A and 11B between the wiring patterns on the common-terminal side and on the individual-terminal side of the duplexer element 101. Accordingly, the high isolation can be effectively maintained as described above.

A high-frequency module according to a second preferred embodiment of the present invention will now be described with reference to FIGS. 3A, 3B, and 4.

FIGS. 3A and 3B are cross-sectional views illustrating concepts of multilayer structures of a high-frequency module 1 according to the second preferred embodiment.

The high-frequency module 1 according to the second preferred embodiment includes a multilayer structure that is different from that of the high-frequency module 1 according to the first preferred embodiment, but includes the same or substantially the same circuit configuration and the same arrangement of discrete components as those of the high-frequency module 1 according to the first preferred embodiment. In the multilayer structure according to the first preferred embodiment, the individual-terminal-side wiring electrode 21 is provided on the top-surface side with respect to the two ground electrodes, and the common-terminal-side wiring electrode 22 is provided on the button-surface side with respect to the two ground electrodes. However, in the multilayer structure according to the second preferred embodiment, the common-terminal-side wiring electrode 22 and the individual-terminal-side wiring electrode 21 are provided on the top-surface side and the bottom-surface side with respect to the two ground electrodes, respectively.

On a layer A' close to the top surface of a multilayer substrate 10A, a common-terminal-side wiring electrode 22' is provided. One end of the common-terminal-side wiring electrode 22' is connected, through a via hole 32', to a common-terminal-side land for a duplexer element 101 provided on the top surface. The other end of the common-terminal-side wiring electrode 22' is connected, through a via hole 41', to one land for a matching element 102 provided on the top surface.

On a layer B' below the layer A' with respect to the top surface, a ground electrode 11A' (corresponding to "a first ground electrode") is provided. The ground electrode 11A' is arranged to cover at least an area of the common-terminal-side wiring electrode 22' provided on the layer A'. In this manner, the common-terminal-side wiring electrode 22' opposes the ground electrode 11A' with a predetermined gap therebetween, so that the impedance of the common-terminal-side wiring electrode 22' can be set to a predetermined value. The ground electrode 11A' on the layer B' is arranged to further cover an area of an individual-terminal-side wiring electrode 21' on a layer D' to be described later.

On a layer C' adjacent to and below the layer B' with respect to the top surface, a ground electrode 11B' (corresponding to "a second electrode") is provided. The ground electrode 11B' is arranged to cover at least the area of the individual-terminal-side wiring electrode 21 on the layer D' to be described later. In this manner, the individual-terminal-side wiring electrode 21' opposes the ground electrode 11B' with a predetermined gap therebetween, so that the impedance of the individual-terminal-side wiring electrode 21' can be set to a predetermined value.

On the layer D' below the layer C' with respect to the top surface, the individual-terminal-side wiring electrode 21' is provided. The individual-terminal-side wiring electrode 21' is connected, through a via hole 31', to an individual-terminal-side land for the duplexer element 101 provided on the top surface.

On a layer E' below the layer D' with respect to the top surface and close to a bottom surface of the multilayer substrate 10A, a ground electrode 12' (corresponding to "a third ground electrode") is provided over substantially the entire surface of the multilayer substrate 10A in plan view.

On the bottom surface of the multilayer substrate 10A, an external-connection electrode 90 is provided. The external-connection electrode 90 is connected to the individual-terminal-side wiring electrode 21' through a via hole 30'. An external-connection ground electrode 90G is also provided on the bottom surface of the multilayer substrate 10A. The external-connection ground electrode 90G is connected, through a via hole 42', to the other land for the matching element 102 provided on the top surface.

A multilayer substrate 10A' illustrated in FIG. 3B differs from the multilayer substrate 10A illustrated in FIG. 3A in that the other land for the matching element 102 is connected to a ground electrode 12 on the layer E' through a via hole 42. The remaining configuration of the multilayer substrate 10A' is the same or substantially the same as that of the multilayer substrate 10A illustrated in FIG. 3A.

The configuration according to the second preferred embodiment provides advantages that are similar to those of the multilayer structure according to the first preferred embodiment. Furthermore, the multilayer structure according to the second preferred embodiment reduces the length of a wiring electrode connecting the duplexer element 101 and the matching element 102 because the wiring electrode is arranged immediately under the top surface of the multilayer substrate 10A including the duplexer element 101 and the matching element 102 mounted thereon. Accordingly, transmission loss of a signal transmitted between the common terminal of the duplexer DPX and the matching circuit MC is effectively reduced.

Figure 4:
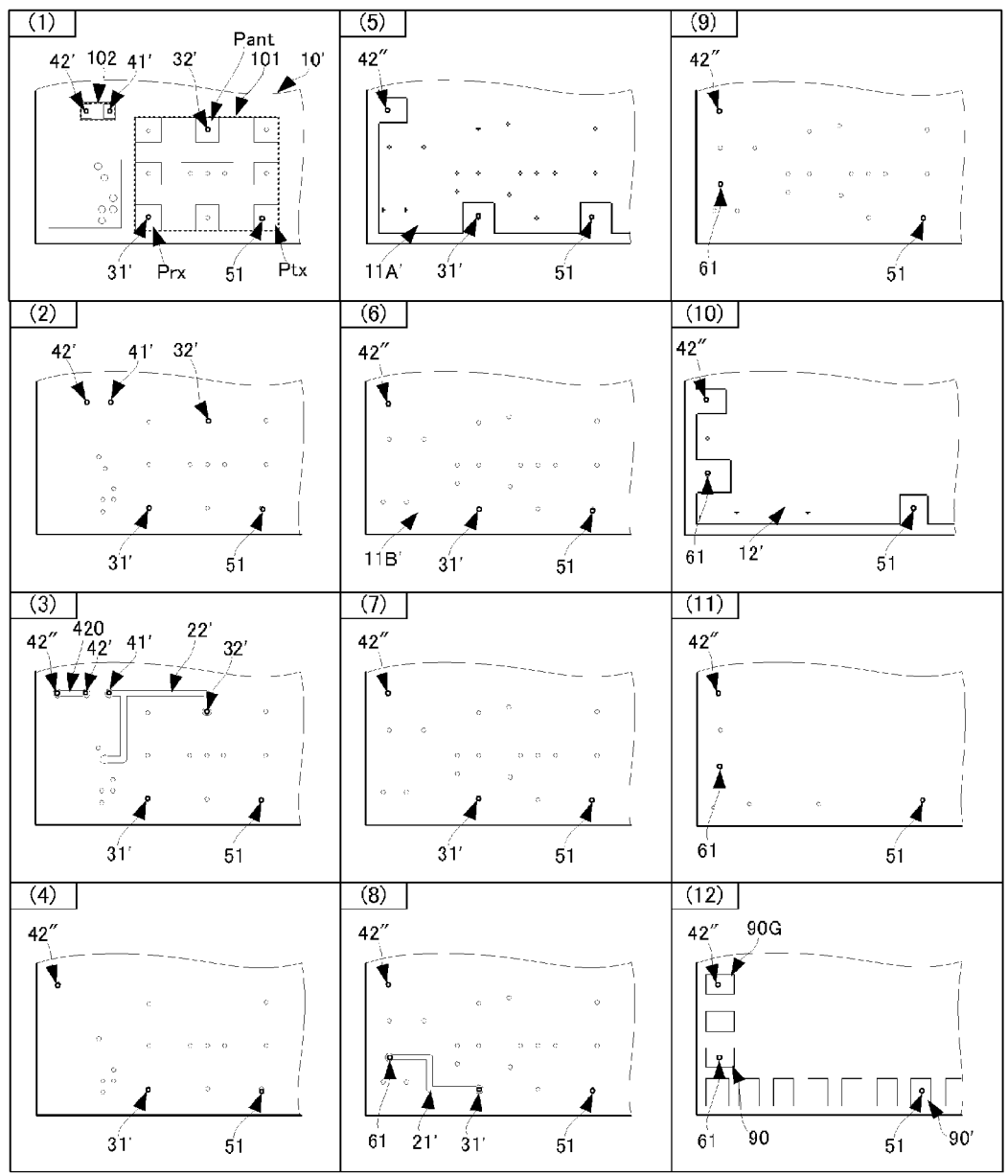
FIG. 4 illustrates the individual layers of the multilayer substrate illustrated in FIG. 3A.

FIG. 4 illustrates the individual layers of the multilayer substrate illustrated in FIG. 3A. The multilayer substrate illustrated in FIG. 4 is the same or substantially the same as the multilayer substrate 10A illustrated in FIG. 3A, except for a pattern connecting the other land for the matching element 102 to ground. More specifically, the pattern connecting the other land for the matching element 102 to the ground is similar to the structure on the layer D illustrated in FIG. 2B according to the first preferred embodiment.

The multilayer substrate illustrated in FIG. 4 includes 12 laminated dielectric layers. Referring to FIG. 4, a top surface layer of the multilayer substrate corresponds to a first layer. The layer number increases towards the bottom surface. That is, a bottom surface layer of the multilayer substrate corresponds to a twelfth layer. Hereinafter, a description is provided based on the layer numbers. Additionally, a mark "○" illustrated in each layer of FIG. 4 indicates a conductive via hole that provides conductivity between electrodes on the different layers in the lamination direction.

On a top surface of the first layer corresponding to the top surface of the multilayer substrate, mounting lands are provided. Discrete components, i.e., the duplexer element 101 (the duplexer DPX) and the matching element 102 (the inductor L) are mounted on the lands in a predetermined positional relationship. In plan view of the first layer in FIG. 4, the switch element SWIC is mounted on a lower left side.

The use of the discrete component of the matching element 102 enables a value of the matching element 102 to be changed simply by replacing the discrete component. In this manner, design of the matching circuit MC including the matching element 102 can be easily changed.

On the second layer, via holes are provided. The via holes include a via hole 32' connected to a common-terminal-side land Pant of the duplexer element 101 corresponding to the common terminal DANT of the duplexer DPX. The via holes also include a via hole 51 connected to an individual-terminal-side land Ptx of the duplexer element 101 corresponding to the individual terminal DRF1 of the duplexer DPX and a via hole 31' connected to an individual-terminal-side land Prx of the duplexer element 101 corresponding to the individual terminal DRF2 of the duplexer DPX. The via holes further include a via hole 41' connected to one land for the matching element 102 and a via hole 42' connected to the other land for the matching element 102.

On the third layer corresponding to the layer A' in FIG. 3A, the common-terminal-side wiring electrode 22' is provided. One end of the common-terminal-side wiring electrode 22' is connected to the via hole 32', and the other end thereof is connected to the via hole 41'. A routing electrode 420 is also provided on the third layer. One end of the routing electrode 420 is connected to the via hole 42', and the other end thereof is connected to a via hole 42" extending to a lower layer from the third layer. The via holes 31' and 51 extending from the second layer are also provided on the third layer.

On the fourth layer, the via holes 31', 42", and 51 extending from the third layer are provided.

On the fifth layer corresponding to the layer B' in FIG. 3A, the ground electrode 11A' is provided. The via holes 31', 42", and 51 extending from the fourth layer are also arranged so as to be electrically isolated from the ground electrode 11A'.

On the sixth layer corresponding to the layer C' in FIG. 3A, the ground electrode 11B' is provided. The via holes 31', 42", and 51 extending from the fifth layer are also arranged so as to be electrically isolated from the ground electrode 11B'.

On the seventh layer, the via holes 31', 42", and 51 extending from the sixth layer are provided.

On the eighth layer corresponding to the layer D' in FIG. 3A, the individual-terminal-side wiring electrode 21' is provided. One end of the individual-terminal-side wiring electrode 21' is connected to the via hole 31', and the other end thereof is connected to a via hole 61 extending to a lower layer from the eighth layer. The via holes 42" and 51 extending from the seventh layer are also provided on the eighth layer.

On the ninth layer, the via holes 42", 51, and 61 extending from the eighth layer are provided.

On the tenth layer corresponding to the layer E' in FIG. 3A, the ground electrode 12' is provided. The via holes 42", 51, and 61 extending from the ninth layer are also provided so as to be electrically isolated from the ground electrode 12'.

On the eleventh layer, the via holes 42", 51, and 61 extending from the tenth layer are provided.

On the twelfth layer, whose back surface corresponds to the bottom surface of the multilayer substrate 10A, a plurality of external-connection electrodes are provided. The plurality of external-connection electrode are arranged along side surfaces of the multilayer substrate 10A preferably to define a rectangle or a substantial rectangle, for example. The external-connection electrodes include the external-connection ground electrode 90G connected to the via hole 42" and external-connection electrodes 90 and 90' connected to the individual-terminal-side via holes 51 and 61 electrically connected to the individual-terminal-side lands Ptx and Prx of the duplexer element 101, respectively. The external-connection electrodes 90 and 90' are arranged to be separated from each other on different sides of the multilayer substrate 10A. In this manner, electromagnetic coupling between the external-connection electrodes 90 and 90' and, consequently, signal leakage through the external-connection electrodes are effectively prevented.

Another circuit element defining the matching circuit may include inner-layer electrodes. In such a case, the circuit element may be defined by electrode patterns arranged between the ground electrode 12' on the tenth layer and the ground electrodes 11A' and 11B' on the fifth and sixth layers, respectively. In this manner, isolation between internal circuit element and the discrete component can be guaranteed.

Although the common-terminal-side wiring electrode 22 is defined by an inner-layer electrode of the multilayer substrate in each of the foregoing preferred embodiments, the common-terminal-side wiring electrode 22 may alternatively be provided on the top surface of the multilayer substrate on which the duplexer element 101 and the matching element 102 are mounted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency module comprising:
a multilayer substrate;
a duplexer mounted on the multilayer substrate and including a common terminal and a plurality of individual terminals connected to the common terminal through different filters; and
a matching circuit mounted on the multilayer substrate or defined by an electrode pattern included in the multilayer substrate and being connected to the common terminal of the duplexer; wherein the multilayer substrate includes:
an individual-terminal-side wiring electrode defined by an electrode pattern provided on a layer of the multilayer substrate;
a common-terminal-side wiring electrode defined by an electrode pattern provided on a different layer of the multilayer substrate from that of the individual-terminal-side wiring electrode; and
first and second ground electrodes provided on different layers between the layer including the common-terminal-side wiring electrode and the layer including the individual-terminal-side wiring electrode in a lamination direction of the layers;
one of the first and second ground electrodes is arranged so as to overlap the individual-terminal-side wiring electrode but not the common-terminal-side wiring electrode in the lamination direction; and
the other of the first and second ground electrodes is arranged to overlap both of the individual-terminal side wiring electrode and the common-terminal-side wiring electrode in the lamination direction.

2. The high-frequency module according to claim 1, wherein an electrode pattern connecting the common terminal of the duplexer to the matching circuit defines the common-terminal-side wiring electrode.

3. The high-frequency module according to claim 2, wherein the electrode pattern connecting the common terminal of the duplexer to the matching circuit is provided on the duplexer mounting surface of the multilayer substrate or on a layer between the duplexer mounting surface and the layers including the first and second ground electrodes.

4. The high-frequency module according to claim 1, wherein the common-terminal-side wiring electrode is defined by an electrode pattern connecting the matching circuit to one of the first ground electrode, the second ground electrode, and a third ground electrode.

5. The high-frequency module according to claim 4, wherein the matching circuit is connected to the third ground electrode via the common-terminal-side wiring electrode.

6. The high-frequency module according to claim 5, wherein
the matching circuit includes a discrete circuit element arranged to be mounted on the multilayer substrate; and
a mounting land arranged to mount the discrete circuit element is directly connected to the third ground electrode.

7. The high-frequency module according to claim 1, wherein the matching circuit includes a discrete circuit element arranged to be mounted on the multilayer substrate.

8. The high-frequency module according to claim 1, wherein
the matching circuit includes a discrete circuit element arranged to be mounted on the multilayer substrate; and
a mounting land arranged to mount the discrete circuit element is directly connected to an external-connection electrode of the multilayer substrate defining a ground connection.

* * * * *